United States Patent
Mares et al.

(10) Patent No.: US 9,231,209 B2
(45) Date of Patent: Jan. 5, 2016

(54) NANOCOMPOSITE MATERIAL, TUNABLE RESISTOR DEVICE, AND METHOD

(71) Applicant: Vanderbilt Unviersity, Nashville, TN (US)

(72) Inventors: Jeremy West Mares, Nashville, TN (US); Sharon M. Weiss, Franklin, TN (US)

(73) Assignee: Vanderbilt University, Nashville, TN (US)

( * ) Notice: Subject to any disclaimer, the term of this patent is extended or adjusted under 35 U.S.C. 154(b) by 132 days.

(21) Appl. No.: 14/081,409

(22) Filed: Nov. 15, 2013

(65) Prior Publication Data

US 2014/0138601 A1    May 22, 2014

Related U.S. Application Data

(60) Provisional application No. 61/727,263, filed on Nov. 16, 2012.

(51) Int. Cl.
*H01L 45/00*    (2006.01)

(52) U.S. Cl.
CPC ............ *H01L 45/1683* (2013.01); *H01L 45/08* (2013.01); *H01L 45/1226* (2013.01); *H01L 45/1253* (2013.01); *H01L 45/1266* (2013.01); *H01L 45/14* (2013.01); *H01L 45/146* (2013.01); *H01L 45/1608* (2013.01); *Y10S 977/779* (2013.01)

(58) Field of Classification Search
CPC .................................................. Y10S 977/779
See application file for complete search history.

(56) References Cited

U.S. PATENT DOCUMENTS

| 7,898,844 | B2 | 3/2011 | Wang et al. |
| 9,035,272 | B2* | 5/2015 | Sheng ................. H01L 45/1608 257/1 |
| 2009/0184397 | A1 | 7/2009 | Gergel-Hackett et al. |
| 2011/0176353 | A1 | 7/2011 | Li et al. |
| 2011/0309321 | A1* | 12/2011 | Yang .................. G11C 13/0007 257/5 |

(Continued)

OTHER PUBLICATIONS

H. Wu, and L.-S. Wang, "Electronic Structure of Titanium Oxide Clusters: TiOy (y=1-3) and (TiO2)n (n=1-4)," J. Chem. Phys., vol. 107, 1997.

(Continued)

*Primary Examiner* — Stephen W Smoot
(74) *Attorney, Agent, or Firm* — Tarolli, Sundheim, Covell & Tummino LLP (57) ABSTRACT

Various embodiments of a composite material are provided. In one embodiment of the present invention a nanometer-scale composite material comprises, by volume, from about 1% to about 99% variable-conductivity material and from about 99% to about 1% conductive material. The composite material exhibits memristive properties when a voltage differential is applied to the nanocomposite. In another embodiment, a variable resistor device includes a first electrode terminal and a second electrode terminal and a nanocomposite in electrical communication with the electrode terminals. The composite material comprises, by volume, from about 1% to about 99% variable-conductivity material and from about 99% to about 1% conductive material. The memristor is tunable as the minimum instantaneous resistance can be altered several orders of magnitude by varying the composition and ratio of the variable-conductivity material and conductive material constituents of the composites.

32 Claims, 7 Drawing Sheets

(56) References Cited

U.S. PATENT DOCUMENTS

| | | | | |
|---|---|---|---|---|
| 2012/0074378 A1* | 3/2012 | Wu | ........................ | B82Y 10/00 257/5 |
| 2012/0091421 A1* | 4/2012 | Wen | ................... | G11C 13/0007 257/4 |
| 2014/0311790 A1* | 10/2014 | Yang | ....................... | H01L 45/08 174/260 |

OTHER PUBLICATIONS

H. Wu, and L.-S. Wang, "A Study of Nickel Monoxide (NiO), Nickel Dioxide (ONiO), and Ni(O2) Complex by Anion Photoelectron Spectroscopy," J. Chem. Phys., vol. 107, pp. 16-21, 1997.

J.H. Kim, X. Li, L.-S. Wang, H.L. De Clercq, C.A. Fancher, O.C. Thomas, and K.H. Bowen, "Vibrationally Resovled Photoelectron Spectroscopy of MgO- and ZnO- and the Low-Lying Electronic States of MgO, MgO-, and ZnO," J. Phys. Chem. A, vol. 105, pp. 5709-5718, 2001.

V.D. Moravec, S. A. Klopcic, B. Chatterjee, and C.C. Jarrold, "The Electronic Structure of ZnO and ZnF Determined by Anion Photoelectron Spectroscopy," Chem. Phys. Lett., vol. 341, pp. 313-318, 2001.

D. Biolek, Z. Biolek, and V. Biolkova, "Pinched Hysteretic Loops of Ideal Memristors, Memcapacitors and Meminductors must be 'self-crossing'," Electron. Lett, vol. 47, 2011.

D.R. Clarke, "Varistor Ceramics," J. Am. Ceram. Soc., vol. 82, pp. 485-502, 1999.

Q. Wen and D.R. Clarks, Modeling the Electrical Characteristics of Polycrystalline Varistors Using Individual Grain Boundary Properties, vol. 41. Westerville, OH: American Ceramic Society 1994.

M. Bartkowiak and G.D. Mahan, "Nonlinear Currents in Voronoi Networks," Phys. Rev B, vol. 51, pp. 10825-10832, 1995.

C.-W. Nan and D.R. Clarke, "Effect of Variations in Grain Size and Grain Boundary Barrier Heights on the Current-Voltage Characteristics of ZnO Varistors," J. Am. Ceram. Soc., vol. 79, pp. 3185-3192, 1996.

D.B. Strukov and R.S. Williams, "Exponential Ionic Drift: Fast Switching and Low Volatility of Thin-Film Memristors," Appl. Phys. A, vol. 94, pp. 515-519, 2009.

V. Lehmann and U. Grüning, "The Limits of Macropore Array Fabrication," Thin Solid Films, vol. 297, pp. 13-17, 1997.

H. Ouyang, M. Christophersen and P.M. Fauchet, "Enhanced Control of Porous Silicon Morphology from Macropore to Mesopore Formation," Phys. Status Solidi A, vol. 202, pp. 1396-1401, 2005.

J.-H. Park, L. Gu, G. Von Maltzahn, E. Ruoslahti, S.N. Bhatia and M.J. Sailor, "Biodegradable Luminescent Porous Silicon Nanoparticles for In Vivo Applications," Nat. Mater., vol. 8, pp. 331-336, 2009.

W. Xiaobin et al., "Spintronic Memristor Through Spin-Torque-Induced Magnetization Motion," Electron Device Letters, IEEE vol. 30, pp. 294-297, 2009.

T. Driscoll et al., "Memristive Adaptive Filters," Appl. Phys. Lett., vol. 97, p. 093502, 2010.

S. Jo et al., "Nanoscale Memristor Device as Synapse in Neuromorphic Systems," Nano Letters, 2010.

Y.V. Pershin and M. Di Ventra, "Experimental Demonstration of Associative Memory with Memristive Neural Networks," Neural Networks, vol. 23, pp. 881-886, 2010.

J. F. Gibbons and W.E. Beadle, "Switching Properties of Thin NiO Films," Solid-State Electronics, vol. 7, pp. 785-790, 1964.

S. Seo, et al., "Reproducible Resistance Switching in polycrystalline NiO Films," Applied Physics Letters, vol. 85, pp. 5655-5657, 2004.

D.C. Kim, et al., "Electrical Observations of Filamentary Conductions for the Resistive Memory Switching in NiO Films," Applied Physics Letters, vol. 88, pp. 202102-202103, 2006.

D.-W. Kim, et al., "Reversible Resistance Switching Behaviors of Pt/NiO/Pt Structures," Japanese Journal of Applied Physics, vol. 46, p. 5205, 2007.

M. Laiho, E. Lehtonen, A. Russell, and P. Dudek, "Memristive Synapses are Becoming Reality" The Neuromorphic Engineer, 2010, 1-3.

J. Maier, "Transport in Electroceramics: Micro-and-Nano-Structural Aspects" J. Eur. Ceram. Soc., 2004, 24, 1251-1257.

R. Malik, D. Burch, M. Bazant, and G. Ceder, "Particle Size Dependence of the Ionic Diffusivity" Nano. Lett., 2010, 10, 4123-4127.

H.L. Tuller, "Ionic Conduction in Nanocrystalline Materials" Solid State Ionics, 2000, 131,143-157.

J. Maier, "Ionic Conduction Space Charge Regions" Prog. Solid State Chem., 1995, 23, 171-263.

C. Kang, C. Phare, S.M. Weiss, Y.A. Vlasov, and S. Assefa, "Photonic Crystal Defects with Increased Surface Area for Improved Refractive Index Sensing," Conference on Lasers and Electro-Optics/International Quantum Electronics Conference, p. CTuL1, 2010.

Y. Jiao and S.M. Weiss, "Design Parameters and Sensitivity Analysis of Polymer-Cladded Porous Silicon Waveguides for Small Molecule Detection," Biosensors and Bioelectronics, vol. 25, pp. 1535-1538, 2010.

Y. Jiao and S.M. Weiss, "Enhanced PNA Detection Sensitivity Based on Polymer-Cladded Porous Silicon Waveguide," Proc. of SPIE, vol. 7553, p. 75530O, 2010.

J.L. Lawrie and S.M. Weiss, "Silicon Photonics for Biosensing Applications," Silicon Photonics for Telecommunications and Biomedical Applications, S. Fathpour and B. Jalali, Eds., ed Boca Raton, Fl.: Taylor & Francis, 2011, pp. 201-230.

Y. Jiao, D. Koktysh, and S.M. Weiss, "Dual Detection Platform with Refractive Index and SERS Sensing Based on Colloidal Gold Functionalized Porous Silicon Substrates," Mater. Res. Soc. Symp. Proc., vol. 1301, pp. 247-252, 2011.

Y. Jiao, D.S. Koktysh, N. Phambu, and S.M. Weiss, "Dual-Mode Sensing Platform Based on Colloidal Gold Functionalized Porous Silicon," Appl. Phys. Lett., vol. 97, pp. 153125, 2010.

Y. Jiao, J.D. Ryckman, P.N. Ciesielski, C.A. Escobar, G.K. Jennings, and S. M. Weiss, "Patterned Nanoporous Gold as an Effective SERS Template," Nanotech., vol. 22, p. 295302, 2011.

Y. Jiao, J.D. Ryckman, M. Liscidini, J.E. Sipe, P.N. Ciesielksi, C.A. Escobar, G.K. Jennings, and S. M. Weiss, "Direct Imprinted Gratings on Nanoporous Gold as Effective Sers Substrates," CLEO: 2011-Laser Applications to Photonics Applications, 2011.

C. Kang, C. Phare, Y.A. Vlasov, S. Assefa, and S. M. Weiss, "Photonic Crystal Slab Sensor with Enhanced Surface Area," Opt. Express, vol. 18, pp. 27930-27937, 2010.

C. Kang, C. Phare, Y.A. Vlasov, S. Assefa, and S.M. Weiss, "Optimization of Defect Hole Placement in Resonant Cavity Sensors," CLEO: 2011—Laser Applications to Photonics Applications, 2011.

X. Wei and S. M. Weiss, "Guided Mode Biosensor Based on Grating Coupled Porous Silicon Waveguide," Opt. Express, vol. 19, pp. 11330-11339, 2011.

X. Wei and S. M. Weiss, "Grating Coupled Waveguide Biosensor Based on Porous Silicon," Mater. Res. Soc. Symp. Proc., vol. 1301, pp. 219-224, 2011.

L. Canhan, Properties of Porous Silicon. London: IEEE, Inspec. 1997.

J.W. Mares, R.C. Boutwell, A. Scheurer, M. Falanga, and W.V. Schoenfeld, "Cubic ZnxMg1-xO and NixMg1-xO Thin Films Grown by Molecular Beam Epitaxy for Deep-UV Optoelectronic Applications," in SPIE, San Francisco, 2010, p. 76031B.

J.W. Mares, R.C. Boutwell, M. Wei, A. Scheurer, and W.V. Schoenfeld, "Deep-Ultraviolet Photodetectors from Epitaxially Grown NixMg1-xO," Appl. Phys. Left., vol. 97, p. 161113, 2010.

M. Wei, R.C. Boutwell, J.W. Mares, A. Scheurer, and W.V. Schoenfeld, "Bandgap Engineering of Sol-gel Synthesized Amorphous Zn1-xMgxO Films," Appl. Phys. Lett., vol. 98, pp. 261913-161923, 2011.

R. Landauer, "Electrical Conductivity in Inhomogeneous Media," AIP Conference Proceedings, vol. 40, pp. 2-45, 1978.

D. Stroud, "Generalized, Effective, Medium Approach to the Conductivity of an Inhomogeneous Material," Phys. Rev. B, vol. 12, pp. 3368-3373, 1975.

W.R. Tinga, W. A. G. Voss, and D.F. Blossey, "Generalized Approach to Multiphase Dielectric Mixture Theory," J. Appl. Phys., vol. 44, pp. 3897-3902, 1973.

(56) References Cited

OTHER PUBLICATIONS

B.A. Everitt, D. Wang, and J. M. Daughton, "Spin Valves with NiO Pinning Layer," 1996, pp. 4657-4659.

Y. Hamakawa, H. Hoshiya, T. Kawabe, Y. Suzuki, R. Arai, K. Nakamoto, M. Fuyama, and Y. Sugita, "Spin-Valve Heads Utilizing Antiferromagnetic NiO Layers," IEEE Trans. Magn., vol. 32, pp. 149-155.

M.D. Stiles, and R.D. McMichael, "Model for Exchange Bias in Polycrystalline Ferromagnet-Antiferromagnet Bilayers," Phys. Rev. B, vol. 59, pp. 3722-3733, Feb. 1999.

J.-M. Choi and S. Im, "Ultraviolet Enhanced Si-Photodetector Using p-NiO Films," Appl. Surf. Sci., vol. 244, pp. 435-438, 2005.

C.E. Rossi, and W. Paul, "The Preparation of NiO Thin Films and their Use in Optical Measurements in the Visible and Ultraviolet," J. Phys. Chem. Solids, vol. 30, pp. 2295-2305, 1969.

G. Wakefield, P.J. Dobson, Y.Y. Foo, A. Loni, A. Simons and J.L. Hutchison, "The Fabrication and Characterization of Nickel Oxide Films and Their Application as Contacts to Polymer/Porous Silicon Electroluminescent Devices," Semicond. Sci. Technol., vol. 12, pp. 1304-1309, 1997.

Y. Zhao, J. Zhang, D. Jiang, C. Shan, Z. Zhang, B. Yao, D. Zhao, and D. Shen, "MgNiO-Based Metal-Semiconductor-Metal Ultraviolet Photodetector," J. Phys. D: Appl. Phys., vol. 42, p. 092007, 2009.

M. Atanasov and D. Reinen, "Non-Local Electronic Effects in Core-Level Photoemission, UV and Optical Electronic Absorption Spectra of Nickel Oxides," J. Electron. Spectrosc. Relat. Phenom., vol. 86, pp. 185-199, 1997.

O. Bengone, M. Alouani, J. Hugel, and P. Blochl, "LDA+U Calculated Electronic and Structural Properties of Nio(001) p (2×2) Surfaces," Comput. Mater. Sci., vol. 24, pp. 192-198, 2002.

S.L. Dudarev, G. A. Botton, S.Y. Savrasov, C.J. Humphreys, and A.P. Sutton, "Electron-Energy-Loss Spectra and the Structural Stability of Nickel Oxide: An LSDA+U Study," Phys. Rev. B., vol. 57, p. 1505, 1998.

A.M. Ferrari, C. Pisani, F. Cinquini, L. Giordano, and G. Pacchioni, "Cationic and Anionic Vacancies on the Nio(100) Surface: DFT+U and Hybrid Functional Density Functional Theory Calculations," J. Chem., Phys., vol. 127, pp. 174711-174718, 2007.

A. Fujimori and F. Minami, "Valence-Band Photoemission and Optical Absorption in Nickel Compounds," Phys. Rev. B, vol. 30, p. 957, 1984.

G.J.M. Janssen and W.C. Nieuwpoort, "Band Gap in NiO: A Cluster Study," Phys. Rev. B, vol. 38, p. 3449, 1988.

H. Kamal, E.K. Elmaghraby, S.A. Ali, and K. Abdel-Hady, "Characterization of Nickel Oxide Films Deposited at Different Substrate Temperatures Using Spray Pyrolysis," J. Cryst. Growth, vol. 262, pp. 424-434, 2004.

P. Luches, E. Groppo, S. D'Addato, C. Lamberti, C. Prestipino, S. Valeri, and F. Bosherini, "NiO and MgO Ultrathin Films by Polarization Dependent XAS," Surf. Sci., vol. 566-568, pp. 84-88, 2004.

R.J. Powell and W.E. Spicer, "Optical Properties of NiO and CoO," Phys. Rev. B, vol. 2, p. 2182, 1970.

W. Zhang, N. Yu, W. Yu, and B. Tang, "Stability and Magnetism of Vacancy in NiO: A GGA+U Study," Eur. Phys. J. B, vol. 64, pp. 153-158, 2008.

N.F. Mott, "The Basis of Electron Theory of Metals, with Special Reference to the Transition Metals," Proc. Phys. Soc. London, Sect. A, vol. 62, pp. 416-422, 1949.

J. Zaanen, G.A. Sawatzky, and J.W. Allen, "Band Gaps and Electronic Structure of Transition-Metal Compounds," Phys. Rev. Lett., vol. 55, p. 418, 1985.

X. Chen, K. Ruan, G. Wu, and D. Bao, "Tuning Electrical Properties of Transparent P-NiO/n-MgZnO Heterojunctions with Band Gap Engineering of MgZnO," Appl. Phys. Lett., vol. 93, pp. 112112-112113, 2008.

K. Kobayashi, M. Yamaguchi, Y. Tomita, and Y. Maeda, "Fabrication and Characterization of In—Ga—Zn—O/NiO Structures," Thin Solid Films, vol. 516, pp. 5903-5906, 2008.

S. Lany, J. Osorio-Guillen, and A. Zunger, "Origins of the Doping Asymmetry in Oxides: Hole Doping in NiO Versus Electron Doping in ZnO," Phys. Rev. B, vol. 75, pp. 241203-241204, 2007.

H. Ohta, M. Hirano, K. Nakahara, H. Maruta, T. Tanabe, M. Kamiya, T. Kamiya, and H. Hosono, "Fabrication and Photoresponse of a pn-heterojunction Diode Composed of Transparent Oxide Semiconductors, p-NiO and n-ZnO," Appl. Phys. Lett., vol. 83, pp. 1029-1031, 2003.

Y. Ohya, H. Koyama, T. Ban, and Y. Takahashi, "Electrical Properties of p-n Contact with Oxide Semiconductor Thin Films Fabricated by Liquid Phase Method," Mater. Sci. Eng. B, vol. 54, pp. 55-59, 1998.

K. Oka, T. Yanagida, K. Nagashima, H. Tanaka, and T. Kawai, "Growth Atmosphere Dependence of Transport Properties of NiO Epitaxial Thin Films," J. Appl. Phys., vol. 104, pp. 013711-013714, 2008.

Y. Vygranenko, K. Wang, and A. Nathan, "Low Leakage p-NiO/i-ZnO/n-ITO Heterostructure Ultraviolet Sensor," Appl. Phys. Left., vol. 89, pp. 172105-172113, 2006, D.C. Look, "Recent Advances in ZnO Materials and Devices," Mater, Sci. Eng., B, vol. 80, pp. 383-387, 2001.

D.C. Look, D.C. Reynolds, J.R. Sizelove, R.L. Jones, C.W. Litton, G. Cantwell, and W.C. Harsch, "Electrical Properties of Bulk ZnO," Solid State Commun., vol. 105, pp. 399-401, 1998.

U. Ozgur, Y. I. Alivov, C. Liu, A. Teke, M.A. Reshchikov, S. Dogan, V. Avrutin, S.J. Cho, and H. Morkoc, "A Comprehensive Review of ZnO Materials and Devices," J. Appl. Phys., vol. 98, pp. 1-130, 2005.

S. Pearton, D. Norton, K, Ip, and Y. Hed, "Recent Advances in Processing of ZnO," J. Vac. Sci. Technol. B, vol. 22, pp. 932-948, 2004.

P. Knauth and H.L. Tuller, "Electrical and Defect Thermodynamic Properties of Nanocrystalline Titanium Dioxide," J. Appl. Phys., vol. 85, pp. 897-902, 1999.

S. Jo, T. Chang, I. Ebong, and B. Bhadviya, "Nanoscale Memristor Device as Synapse in Neuromorphic Systems," Nato. Lett., Jan. 1, 2010.

L. Chua, "Memristor—Missing Circuit Element," IEEE Trans. on Circuit Theo., vol. CT18, pp. 507-519, Jan. 1, 1971.

L. Chua, "Resistance Switching Memories and Memristors," Appl. Phys. A., vol. 102, pp. 765-783, 2011.

W.-Y. Chang, Y.-C. Lai, T.-B. Wu, S.-F. Wang, F. Chen, and M.-J. Tsai, "Unipolar Resistive Switching Characteristics of ZnO Thin Films for Nonvolatile Memory Applications," Appl. Phys. Lett., vol. 92, pp. 022110-022110-3, 2008.

L. Courtade, C. Turquat, C. Muller, J.G. Lisoni, L. Goux, D.J. Wouters, D. Goguenheim, P. Roussel, and L. Ortega, "Oxidation Kinetics of Ni Metallic Films: Formation of NiO-Based Resistive Switching Structures," Thin Solid Films, vol. 516, pp. 4083-4092, 2008.

K.M. Kim, and Y.-K. Choi, "Resistive Switching in Pt/Al2O3/TiO2/Ru Stacked Structures," Electrochem. Solid-State Lett., vol. 9, p. G343, 2006.

S. Kim and Y.-K . Choi, "Resistive Switching of Aluminum Oxide for Flexible Memory," Appl. Phys. Lett., vol. 92, p. 223508, 2008.

J.-W. Park, J.-W. Park, D.-Y. Kim and J.-K. Lee, "Reproducible Resistive Switching in Nanstoichiometric Nickel Oxide Films Grown by rf Reactive Sputtering for Resistive Random Access Memory Applications," J.Vac. Sci. Technol., A., vol. 23, pp. 1309-1313, 2005.

K. Tsunoda, K. Kinoshita, H. Noshiro, Y.Yamazaki, T. Iizuka, Y. Ito, A. Takashahi, A. Okano, Y. Sato, T. Fukano, M. Aoki, and Y. Sugiyama, "Low Power and High Speed Switching of Ti-Doped NiO ReRAM Under Unipolar Voltage Source of Less than 3 V," IEEE International Electron Devices Meeting, 2007, pp. 767-770.

C. Walczyk, C. Wenger, R. Sohal, M. Lukosius, A. Fox, J. Dabrowski, D. Wolansky, B. Tillack, H.-J. Mussig, and T. Schroeder, "Pulse-Induced Low-Power Resistive Switching in HfO2 Metal-Insulator-Metal Diodes for Nonvolatile Memory Applications," J. Appl. Phys., vol. 105, p. 114103, 2009.

J. Wu and R.L. McCreery, "Solid State Electrochemistry is Molecular Heterojunctions as the Basis of the TiO2 "Memristor"," J. Electrochem. Soc., vol. 156, pp. P29-P37, Jan. 1, 2009.

J-B. Yum, S. Kim, S. Seo, M.-J. Lee, D.C. Kim, S.E. Ahn, Y.S. Park, J. Kim, and H. Shin, "Random and Localized Resistive Switching

(56) References Cited

OTHER PUBLICATIONS

Observation in Pt/NiO/Pt," Physica Status Solidi (RRL)-Rapid Research Letters, vol. 1, pp. 280-282, 2007.

T. Berzina, A. Smerieri, M. Bernabo, A. Pucci, G. Ruggeri, V. Erokhin, and M.P. Fontana, "Optimization of an Organic Memristor as an Adaptive Memory Element," J. Appl. Phys., vol. 105, pp. 124515-124525, 2009.

J.C. Scott, and L.D. Bozano "Nonvolatile Memory Elements Based on Organic Materials," Adv. Mater, vol. 19, pp. 1452-1463, 2007.

X. Wang, Y. Chen, H. Xi, H. Li, and D. Dimitar, "Spintronic Memristor through Spin-Torque-Induced Magnetization Motion," IEEE Electr. Device, L., vol. 30, pp. 294-297, 2009.

Y.V. Pershin and M. Di Ventra, "Spin Memristive Systems: Spin Memory Effects in Semiconductor Spintronics," Phys. Rev. B., vol. 78, p. 113309, 2008.

D.B. Strukov, G.S. Snider, D.R. Stewart, and R.S. Williams, "The Missing Memristor Found," Nature, vol. 453, pp. 80-83, 2008.

S. Williams, "How We Found the Missing Memristor," IEEE Spectr., vol. 45. pp. 24-31, Jan. 1, 2008.

J. Yang, M. Pickett, X. Li, D. Ohlberg, D. Stewart, and R. Williams, "Memristive Switching Mechanism for Metal/Oxide/Metal Nanodevices," Nat Nanotechnol, vol. 3, pp. 429-433, 2008.

J. Yang, J. Strachan, F. Miao, M.-X. Zhang, M. Pickett, W. Yi, D. Ohlberg, G. Medeiros-Ribeiro, and R. Williams, "Metal/TiO2 Interfaces for Memristive Switches," Appl. Phys. A, vol. 102, pp. 785-789, 2011.

J.F. Gibbons and W. E. Beadle, "Switching Properties of Thin NiO Films," Solid-State Elect., vol. 7, p. 785, 1964.

G. Chern, S.D. Berry, D.M. Lind, H. Mathias, and L.R. Testardi, "Modulated Electric-Conductivity in Fe3O4/NiO Superiattices," Appl. Phyl. Lett., vol. 58, pp. 2512-2513, Jun. 1991.

S. Seo, M.J. Lee, D.H. Seo, E. J. Jeoung, D.S. Suh, Y.S. Joung, I.K. Yoo, I.R. Hawang, S.H. Kim, I.S. Byun, J.S. Kim, J.S. Choi, and B.H. Park, "Reproducible Resistance Switching in Polycrystalline NiO films," Appl. Phys. Ltt. vol. 85, p. 5655, 2004.

D.C. Kim, S. Seo, S.E. Ahn, D.S. Suh, M.J. Lee, B.H. Park, I.K. Yoo, I.G. Baek, H.J. Kim, E.K. Yim,. J.E. Lee, S. O. Park, S. Kim, U.I. Chung, J.T. Moon, and B.I. Ryu, "Electrical Observations of Filamentary Conductions for the Resistive Memory Switching in NiO Films," Appl. Phys. Lett., vol. 88, pp. 202102-202103, 2006.

Y.-H. You, B.-S. So, J.-H. Hawang, W. Cho, S.S. Lee, T.-M. Chung, C.G. Kim, and K.-S. An, "Impedance Spectroscopy Characterization of Resistance Switching NiO Thin Films Prepared through Atomic Layer Deposition," Appl. Phys. Lett.,. vol. 89, pp. 222105-222113, 2006.

D.-W. Kim, B.H. Park, R. Jung, and S.Seo, "Reversible Resistance Switching Behaviors of Pt/NiO/Pt Structures," Jpn. J. Appl. Phys., vol. 46, p. 5205, 2007.

M.-D. Lee, C.-H. Ho, C.-K. Lo, T.-Y. Peng, and Y.-D. Yao, "Effect of Oxygen Concentration on Characteristics of NiOx-Based Resistance Random Access Memory," IEEE Trans. Magn., vol. 43, pp. 939-942, 2007.

S.R. Lee, K. Char, D. C. Kim, R. Jung, S. Seo, X. S. Li, G. S. Park and I.K. Yoo, "Resistive Memory Switching in Epitaxially Grown NiO," Appl. Phys. Lett., vol. 9, pp. 202115-202123, 2007.

K.C. Min, M. Kim, Y.H. You, S. S. Lee, Y.K. Lee, T. M. Chung, C.G. Kim, J. H. Hwang, K.S. An, N.S. Lee, and Y. Kim, "NiO Thin Films by MOCVD of Ni (dmamb)2 and Their Resistance Switching Phenomena," Surf. Coat. Technol., vol. 201, pp. 9252-9255, 2007.

R. Waser, Dittmann R., Staikov G., and Szot K., "Redox-Based Resistive Switching Memories-Nanoionic Mechanisms, Prospects, and Challenges," Adv. Mater., vol. 21, pp. 2632-2663, 2009.

R. Waser and M. Aono, "Nanoionics-Based Resistive Switching Memories," Nat. Mater., vol. 6, pp. 833-840, 2007.

W.C. Chein, Y.R. Chen, Y.C. Chen, A.T.H. Chuang, F. M. Lee, Y.Y. Lin, E.K. Lai, Y.H. Shih, K.Y. Hsieh, and C.-Y. Lu, "A Forming Free WOx Resistive Memory Using a Novel Self-Aligned Field Enhancement Feature with Excellent Reliability and Scalability," IEDM: Memory Technology-Resistive RAMs, 2010.

S.-J. Choi, G.-B. Kim, K.Lee, K.-H. Kim, W.-Y. Yang, S. Cho, H.-J. Bae, D.-S. Seo, S-I. Kim, and K.-J. Lee, "Synaptic Behaviors of a Single Metal-Oxide-Metal Resistive Device," Appl. Phys. A, vol. 102, pp. 1019-1025, 2011.

M.J. Kim, I.G. Baek, Y.H. Ha, S.J. Balk, J.H. Kim, D.J. Seong, C.R. Lim, Y.G. Shin, S. Choi, and C. Chung, "Low Power Operating Bipolar TMO ReRAM for Sub 10 nm Era," IEDM Memory Technology—Resistive Rams, 2010.

W. Zhu, T.P. Chen, Z. Liu, M. Yang, Y. Liu, and S. Fung, "Resistive Switching in Aluminum/Anodized Aluminum Film Structure without Forming Process," J. Appl. Phys., vol. 106, p. 093706, 2009.

J.-H. Choi, S. Nath, and J.-M. Myoung, "Controllable Resistance Switching Behavior of NiO/SiO2 Double Layers for Nonvolatile Memory Applications," Appl. Phys. Lett., vol. 95, p. 062105, 2009.

J.C. Bruyer and B.K. Chakrabverty, "Switching and Negative Resistance in Thin Films of Nickel Oxide," Appl. Phys. Lett., vol. 16, pp. 40-43, 1969.

N. Xu, L. Liu, X. Sun, X. Liu, D. Han, Y. Wang, R. Han, J. Kang, and B. Yu, "Characteristics and mechanism of conduction/set process in TiN/ZnO/Pt Resistance Switching Random-Access Memories," Appl. Phys. Lett., vol. 92, pp. 232112-232113, 2008.

J. Maier, "On the Conductivity of Polycrystalline Materials," Berichte der Bunsengesellschaft für physikalische Chemie, vol. 90, pp. 26-33, 1986.

H.L. Tuller, "ionic Conduction in Nanocrystalline Materials," Solid State Ionics, vol. 131, pp. 143-157, 2000.

G. Rong and S.M. Weiss, "Influence of Biomolecule Size on Performance of Nanostructured Sensing Devices," Proc. of SPIE, vol. 6769, p. 676909, 2007.

G. Rong, A. Najmaie, J.E. Sipe, and S.M. Wiess, "Nanoscale Porous Silicon Waveguide for Label-Free DNA Sensing," Biosensors & Bioelectronics, vol. 23, pp. 1572-1576, 2008.

G. Rong, J.D. Ryckman, R.L. Mernaugh and S.M. Weiss, "Label-Free Porous Silicon Membrane Waveguide for DNA Sensing," Appl. Phys. Left., vol. 93, p. 161109, 2008.

X. Wei, C. Kang, M. Liscidini, G. Rong, S.T. Reterrer, M. Patrini, J.E. Sipe, and S.M. Weiss, "Grating Couplers on Porous Silicon Planar Waveguides for Sensing Applications," J. Appl. Phys., vol. 104, p. 123113, 2008.

S.M. Weiss, "Biological Applications of Silicon NanostrUctures," in Silicon Nanophotonics: Base Principles, Present Status, and Perspectives, L. Khriachtchev, Ed., ed Hackensack: World Scientific Publishing Company, 2008, pp. 425-448.

Y. Jiao, G. Rong, and S.M. Weiss, "Porous Waveguide in the Kretschmann Configuration for Small Molecule Detection," Proc. of SPIE, vol. 7322, p. 732205, 2009.

G. Rong and S.M. Weiss, "Biomolecule Size-Dependent Sensitivity of Porous Silicon Sensors," Phys. Status Solidi A, vol. 206, pp. 1365-1368, 2009.

X. Wei, C. Kang, G. Rong, S.T. Retterer, and S.M. Weiss, "Porous Silicon Waveguide with Intergrated Grating Coupler for DNA Sensing," Proc. of SPIE, vol. 71, p. 70670C, 2009.

S.M. Weiss, G. Rong, and J.L. Lawrie, "Current Status and Outlook for Silicon-Based Optical Biosensors," Physica. E., vol. 41, pp. 1071-1075, 2009.

S.M Weiss and G. Rong, "Porous Silicon Waveguides for Small Molecule Detection," in Nanoscience and Nanotechnology for Chemical and Biological Defense, R. Nagarajan, et al., Eds., ed: Oxford University Press, 200 pp. 184-194, 2009.

* cited by examiner

NANOCOMPOSITE MATERIAL, TUNABLE RESISTOR DEVICE, AND METHOD

RELATED APPLICATION

This application claims the benefit of U.S. Provisional Patent Application Ser. No. 61/727,263, filed Nov. 16, 2012, the entirety of which is hereby incorporated by reference for all purposes.

GOVERNMENT FUNDING

This invention was made with government support under Grant No. HDTRA1-10-0041, awarded by the Defense Threat Reduction Agency, and Grant Nos. DMR0957701 (equipment grant), and DMR0963361 (facilities renovation grant) awarded by the National Science Foundation. The United States government has certain rights to the invention.

TECHNICAL FIELD

The present invention relates generally to composite materials, variable resistor devices, and the processes for making the composite materials and variable resistor devices.

BACKGROUND

A type of variable resistor device commonly referred to as a "memristor" is a passive two-terminal circuit element in which its resistive state depends upon the voltage or current history of the element. More specifically, the resistive state is characterized by the relationship between the charge and flux. The resistance may vary continuously, or it may change discontinuously between distinct, non-volatile resistance states in resistively switched devices. Memristors retain their resistive states even when no potential is applied across them. They provide opportunity for improved solutions for high-density and energy efficient non-volatile data storage.

Memristors can behave as a digital as well as analogdevice, and therefore, they are not only feasible for performing storage operations but they can also serve as components of analog computer architectures such as artificial neural networks (ANNs), which can out-perform von Neumann architectures in many computational tasks. The use of memristors in ANNs is desirable because such components may facilitate the conversion of software-based ANN implementations to entirely hardware-based platforms which are faster, more efficient and easier to manufacture. Nevertheless, the use of memristors in many practical implementations is prohibited because macroscale and high-power memristor devices have not been achievable.

Nanometer-scale memristive devices can be used in many integrated microelectronics applications, however, they have a low current density tolerance and thus their use in high-power system applications is limited. The most widely investigated and successfully demonstrated class of materials for memristive phenomena are metal-oxides. In memristive metal-oxide devices, ionic defects migrate under the influence of an applied electric field and vary in density throughout the volume of the metal oxide. Variable resistance arises when the defect mobility is high enough to cause defect density gradients across the metal-oxide structure within practical time parameters. Since there is a limited ion migration path length in memristive metal oxides, many of these oxides used for state of the art memristors do not exhibit the same properties at a macroscopic scale, and therefore, macroscale memristive devices have not been achievable. Thus, there is a need for memristive materials and devices for broader application.

SUMMARY

According to one embodiment of the present invention, a nanometer-scale composite material, colloquially referred to as a "nanocomposite" comprises, by volume, from about 1% to about 99% variable-conductivity material and from about 99% to about 1% conductive material. The variable-conductivity material and conductive material comprise nanometer-scale particles which have an average size that ranges from about one nanometer to about one micron along a maximum lineal dimension of the particle. The composite material exhibits memristive properties when a voltage differential is applied to the composite material. In another embodiment, the materials of the composite compositions described above are present in a volume ratio of variable-conductivity material to conductive material that ranges from about 99%:1% to about 1%:99%.

In another embodiment of the present invention, a variable resistor device, or memristor, comprises a composite material and a first electrode terminal and a second electrode terminal in electrical communication with the composite material. The composite material comprises, by volume, from about 1% to about 99% variable-conductivity material and from about 99% to about 1% conductive material.

A method for making the composite material, according to an embodiment of the present invention, comprises hybridizing a nanometer-scale conductive material with a nanometer-scale variable-conductivity material to form a composite material comprising, by volume, from about 1% to about 99% variable-conductivity material and from about 99% to about 1% conductive material. In another embodiment the above method further includes applying pressure to the mixture to form a composite. In another embodiment the method further comprises fabricating a nanometer-scale conductive material into a film structure having pores formed therein, and hybridizing the variable-conductivity material into the pores of the film structure material comprising, by volume, from about 1% to about 99% variable-conductivity material and from about 99% to about 1% conductive material.

The resulting composites and variable resistor devices can be tuned for various electronic application requirements ranging from discrete states to variable properties in analog devices and over a wide range of power usage.

BRIEF DESCRIPTION OF THE DRAWINGS

The foregoing and other features of the present invention will become apparent to those skilled in the art to which the present invention relates upon reading the following description with reference to the accompanying drawings, in which.

DETAILED DESCRIPTION

Various embodiments of a composite material and embodiments of a variable resistor device comprising the composite material are described herein. In addition, various embodiments of the method for making the composite materials and making the variable resistor devices are disclosed.

In one embodiment of the present invention, a nanometer-scale composite material comprises, by volume, from about 1% to about 99% variable-conductivity material and from about 99% to about 1% conductive material, in another embodiment from about 10% to about 90% variable-conductivity material and from about 90% to about 10% conductive material, in another embodiment from about 25% to about 75% variable-conductivity material and from about 75% to about 25% conductive material, in another embodiment, from about 35% to about 65% variable-conductivity material and from about 65% to about 35% conductive material; and in yet another embodiment from about 45% to about 65% variable-conductivity material and from about 65% to about 45% conductive material. The variable-conductivity material and conductive material comprise nanometer-scale particles. The term "nanometer-scale" means that the particles have an average size that ranges from about one nanometer to about one micron along a lineal dimension of the particle, in alternative applications or embodiments from about one nanometer to about one thousand nanometers, and in yet other embodiments, from about one nanometer to about one hundred nanometers. The lineal dimension of a particle depends at least in part upon the geometry of the particle. For example, the average particle size is based on the diameter if the particle is spherical, or as another example, the average shape can be based on a lineal side of the particle.

The variable-conductivity material of the composite is a material that exhibits a variable conductivity under applied voltage, for example a metal oxide and a solid ionic conductor material. A solid ionic conductor material is a material that exhibits ionic conductivity including high-mobility ionic conductivity with some degree of electronic conduction. Examples of variable-conductivity materials that are metal oxides include, but are not limited to, nickel oxide, zinc oxide, titanium dioxide, hafnium oxide, silicon dioxide, vanadium oxide and combinations thereof. Examples of variable-conductivity materials that are solid ionic conductor materials include, but are not limited to, silver iodide, copper iodide, lanthanum fluoride, silver fluoride, and combinations thereof.

The conductive material of the composite is a metal or a semi-conductive material that is doped. Examples of conductive or semi-conductive metals include but are not limited to, silver, gold, silicon, germanium, gallium arsenide and combinations thereof. The semi-conductive metal may be a doped material, for example p-type or n-type doped material.

The composites herein can optionally include additive materials in an amount, by volume, that is less than about 25%, in another embodiment from about 0.01% to about 10%, and in another embodiment from about 0.01% to about 5%. Additive materials include, but are not limited to, fillers, adhesives or binders, chemical solutions, and in another embodiment less than about 1%. For example, additives can function as fillers to fill void regions between small particles. Additives that function as adhesives, including but not limited to epoxy, for example a conductive epoxy such as a silver-based epoxy, can be used to promote adhesion and mechanical stability of the nanocomposite in its final solid form. In addition, the variable conductivity material can be present in a chemical solution, for example a nickel-oxide solution gel or "sol gel".

It has also discovered, in accordance with embodiments of the invention herein, that the volumetric ratio of the variable-conductivity material relative to the conductive material affects the electrical properties of the composite. In another embodiment of the present invention, the variable-conductivity material and the conductive material of the composites described above are present in a volume ratio of variable-conductivity material to conductive material, i.e. volume variable-conductivity material: volume conductive material that ranges from about 1%:99% to 99%:1%; in another embodiment from about 10%:90% to about 90%:10%; in another embodiment from about 35%:65% to about 75%:25%; in another embodiment from about 40%:60% to about 70%:30%; and in another embodiment from about 48%:52% to about 60%:40%.

An example of a metal-oxide/conductive material nanocomposite, in accordance with the present invention, is a nickel oxide/silicon composite which comprises, by volume, from about 1% to about 99% nickel oxide and from about 99% to about 1% silicon; in another embodiment from about 10% to about 90% nickel oxide and from about 90% to about 10% silicon; in another embodiment from about 25% to about 75% nickel oxide and from about 75% to about 25% silicon; and in yet another embodiment, from about 35% to about 65% nickel oxide and from about 65% to about 35% silicon. In addition, the volume ratio of nickel-oxide to silicon ranges from about 1%:99% to about 99%:1%; in another embodiment from about 10%:90% to about 90%:10%; in another embodiment from about 35%:65% to about 75%:25%; and in another embodiment from about 48%:52% to about 60%:40%.

It has been discovered that the composite materials, or "nanocomposites" described herein, having varying compositions of a variable-conductivity material and a conductive material exhibit memristive properties or "memristance" when a voltage differential is applied to the composite materials. The change in volume ratio results in variation in electrical properties, including the conductivity and resistivity of the composites. Although not wishing to be bound by any particular theory, the material interfaces between the variable-conductivity material and the conductive material, i.e. trans-interface conduction, impacts the overall conductivity of the composite material.

The property termed "memristance" may be defined as the electrical behavior of a passive, two-terminal device which is indicative of a memristor or memristive system and cannot be associated with the other three fundamental linear two-terminal devices, i.e., resistors, capacitors or inductors. Particular behaviors are described, in general, by a fundamental mathematical relationship between device charge and flux, and therefore, these devices are categorized as memristive devices or in some cases, memristive systems. The terms "memristive device" and "memristor" can be used interchangeably.

Composite materials that exhibit memristive properties, or memristance as used herein, means that the when a voltage differential is applied to the composite the device exhibits: 1) "variable conductivity" and 2) "state persistence. More specifically, the term "variable conductivity" means that the conductivity of the device varies as a function of the applied voltage history. As a voltage is applied across the device over time, the current through the device will increase (or decrease, in certain cases) in a particular manner, for example as described by a mathematical definition. In the case of an ideal memristor the current may increase indefinitely while, in practical devices, it will increase until some saturation is encountered. However, when the voltage is removed, current will cease to flow. This behavior results in a "pinched" hysteresis current-voltage curve when a sinusoidally varying voltage is applied.

"State persistence" is closely related to the term "non-volatility" which is more commonly applied to binary-state memory elements; however, as used herein, state-persistence also applies to continuous- or analog-state memristors. State-persistence implies that, if the conductivity is allowed to grow to some value and the applied voltage is removed, i.e. made zero, that the conductivity will retain that value for some time termed the "state-persistence time" and may be measured at a later point in time by application of a subsequent voltage and simultaneous current measurement. The ranges of conductivity variation and the minimum conductivity of the various embodiments of nanocomposites herein are considered for potential applications of memristors. The minimum conductivity (also known as the maximum resistance state) is typically the resistance state observed when the device has been exposed to zero net applied voltage, and it may be considered the device "off" state in many applications.

Nanocomposites may facilitate the design of devices with different minimum conductivity as well as different ranges of conductivity variation. For example, a nanocomposite which is comprised of 10% nickel oxide and 90% gold exhibits a high minimum conductivity due to the highly conductive gold component, while also exhibiting a very narrow range of conductivity variation due to the small volume of NiO. Conversely, a device composed of 90% nickel oxide and 10% gold exhibit a much lower minimum conductivity due to the highly resistive NiO and a greater range of conductivity variation.

A minimum range of conductivity variation for a memristor should be at least about 50% of the minimum conductivity to allow for detection or measurement of state changes. In addition, the variation in conductivity of the devices for practical application typically ranges from about 50% to about 100,000% of the minimum device conductivity. For some applications, a much greater relative conductivity variation is desired than in others. For example, one of the devices presented in FIG. 11$b$ (the 30 mA/cm$^2$ curve) comprising a nanocomposite of nickel oxide and silicon shows a conductivity change of approximately two orders of magnitude (~10,000%) under the specific conditions applied. These conductivity ranges can be converted into resistance ranges to exemplify practical values. For example, a memristive device with a maximum resistance ("off" state) of about 1.5 kΩ would have a practical minimum resistance of as high as about 1 kΩ which would be reached after some period of applied voltage. However, based on the aforementioned ranges of variation, a device with a maximum resistance of about 1 MΩ is likely to have a minimum resistance of as low as about 1 kΩ, or smaller. Similarly, devices with a maximum resistance of about 7.5 MΩ, to be practical, must have a minimum resistance no greater than 5 GΩ.

Characterization of electrical properties such as the variable conductivity and state-persistence of composite materials described herein, may be demonstrated with two straightforward electrical testing protocol. To demonstrate variation in conductivity, it is common to apply a sinusoidally varying voltage with zero DC offset, such that the voltage across the device oscillates between positive and negative values. Under this test, the current-voltage curve for a memristive device will exhibit a hysteresis loop which spans the first and third quadrants of a Cartesian plot and will cross the origin. This hysteresis curve is therefore described as "pinched" and is a generally accepted trait of memristors and memristive systems.

Testing for state-persistence involves the application of voltage pulses which are positive and are separated by periods of zero voltage (i.e., a pulse train). When tested in this manner, memristors exhibit the growth of current (i.e., decrease in resistance) with each successive pulse, until saturation is reached, and zero current during periods of zero applied voltage. This continued current growth is attributed to the property of state-persistence. The maximum amount of zero-voltage time (lowest pulse repetition rate) over which memristive devices will exhibit state-persistence is referred to as the maximum state-persistence time.

The particle size and particle size distribution of nanoparticles used to form variable resistor device or memristor can have a bearing on the properties of the ultimate products obtained. For example, size impacts the response speed of the variable-conductivity element, and resistance changes more quickly for smaller particle size than for larger particle size. This is due, at least in part, to smaller total distance that ions must travel across a particle/grain, as well as increased ion mobility (or conductivity). Each composite material may have its own optimum particle size depending upon the material constituents. Many variable-conductivity materials, e.g. metal oxides, solid ionic conductor materials, etc., and conductive materials, e.g. doped silicon, are available commercially in nanometer particle size ranges, however, they may be commercially available in larger particle size ranges, in which case such source particles can be mechanically worked, such as by ball milling or mechanical mixing, to reduce the particle size to the desired range. Mechanical working breaks up any agglomerates of metal particles which may have formed and, additionally, insures homogenous distribution of the individual particles.

Figure 1:
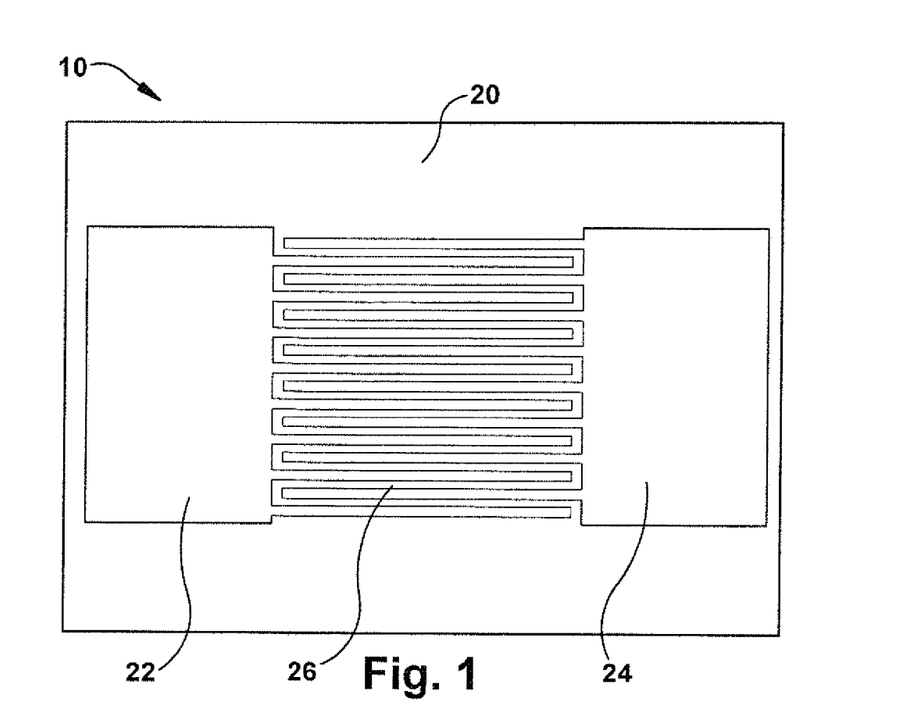
FIG. 1 is a schematic top view illustration of a variable resistor device, according to an embodiment of the present invention.
Figure 2:
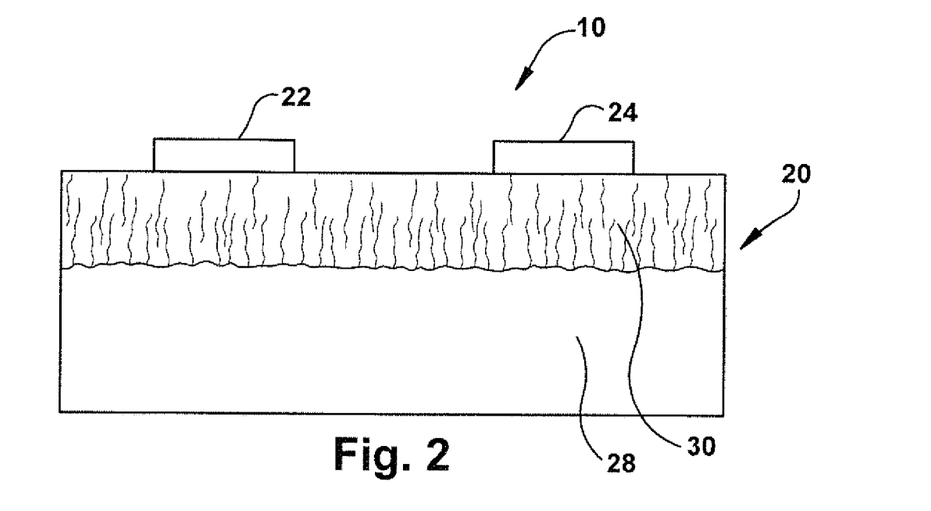
FIG. 2 is a schematic cross-sectional illustration of the variable resistor device of FIG. 1, according to an embodiment of the present invention.
Figure 3A:
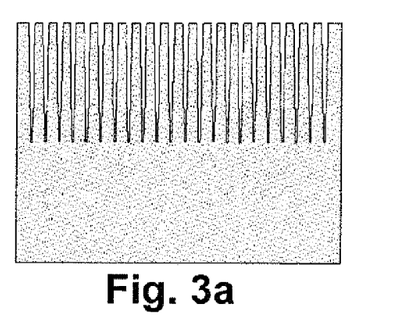
FIGS. 3a, 3b, 3c and 3d are side schematic profile images of the composite materials showing straight parallel pores, parallel branched pores; crossing straight pores, and highly tortuous and interconnected pores, respectively, according to an embodiment of the present invention.
Figure 3B:
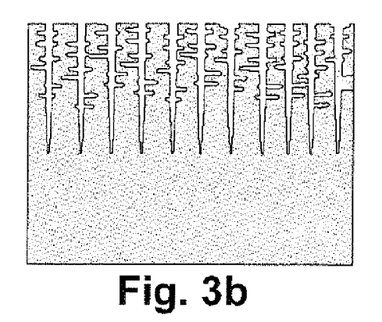
Figure 3C:
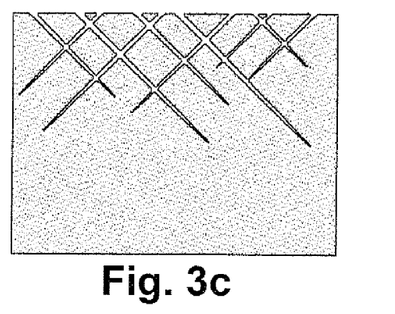
Figure 3D:
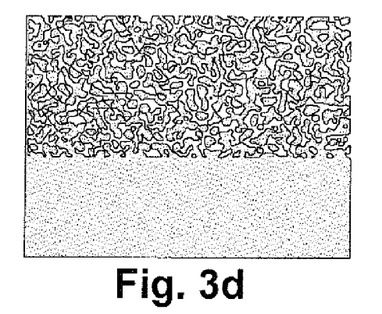

The present invention also provides for various embodiments of a variable resistor device, or "memristor" comprising a first electrode terminal, a second electrode terminal, and a composite material of variable-conductive material and conductive material including the embodiments of the composite materials described above. FIG. 1 and FIG. 2 are illustrations of the top view and side view, respectively, of a representative two-terminal variable-resistor device 10, or memristor, according to an embodiment of the present invention. Variable resistor device 10 includes a composite material 20 comprising a variable-conductivity material and a conductive material, as described above, and contact electrodes 22 and 24.

The contacts 22, 24 are shown in an interdigitated design 26, however, a variety of alternative designs are possible. The electrical contacts can be fabricated via conventional photolithography, along with thermal metal evaporation, in order to produce contacts with separations ranging from about 1 to about 100 μm and in another embodiment from about 2 to about 25 μm. A variety of metals can be used to fabricate the contacts including, but not limited to, nickel (Ni), aluminum (Al), platinum (Pt), and gold (Au) to ensure electrical connections are made to the devices. The memristive behavior of the variable-conductivity device is expected to be dictated predominately by the hybrid material composition, not the contact metal, although the contact metal may contribute an additional Shottky-like energy barrier.

As described above, the various embodiments of composite material 20 comprise nanometer-scale particles of a variable-conductivity material, for example a solid ionic conductor material, or a metal oxide, and a conductive material, such as a metal or a semiconductor. These materials are combined in controlled compositions and ratios so as to alter or tune the electronic properties of the device. The composition and volumetric ratio of the two materials dictates the fraction of the composite which exhibits variable conductivity, thereby determining the dynamic conductivity properties.

FIG. 2 is a side view illustration of the memristor 10 of FIG. 1. This illustration shows composite material 20 fabricated as a film structure of conductive material 28 having pores formed therein and variable-conductivity 30 within the pores. The composite material 20 is a matrix of conductive material, or host material, and the variable-conductivity material, or intercalating material, that fills the pores of the conductive material to make up the film structure. The porosity of the host material can vary widely depending on the average size of the pores. In one embodiment the average size of the pore, measured in diameter or length for example, can range from about one nanometer to about 100 microns, in another embodiment from about one nanometer to about one micron, and in another embodiment from about one nanometer to about 100 nanometers. The nanocrystallite size of the variable-conductivity material is dictated at least in part by the pore size it fills, and the physical and electrical characteristics of the composite, such as for example resistivity, can be varied depending upon the average pore size.

The geometry of the pore can be one of several three-dimensional geometric shapes, including but not limited to, a cylinder, a rectangular channel, and any polygonal channel for example. A broad diversity of pore morphologies can be readily achieved in conductive material, or host matrix, through appropriate selection of doping type, crystal orientation, and electrolyte composition. Porous silicon morphologies can be qualitatively characterized as follows: 1) parallel pores; 2) parallel branched pores; 3) crossing, straight pores; and 4) tortuous, interconnected pores as shown in FIGS. 3a, 3b, 3e, and 3d, respectively.

The thickness of composite material 20, for example a composite film thickness, can range from about 100 nm to about 100 μm, and in another embodiment from about 200 nm to about 10 μm. The composite material 20 can also have discrete portions of varying porosity, materials, and morphology in a single composite material, such as a film, and also in a completed variable resistor device 10.

Figure 4:
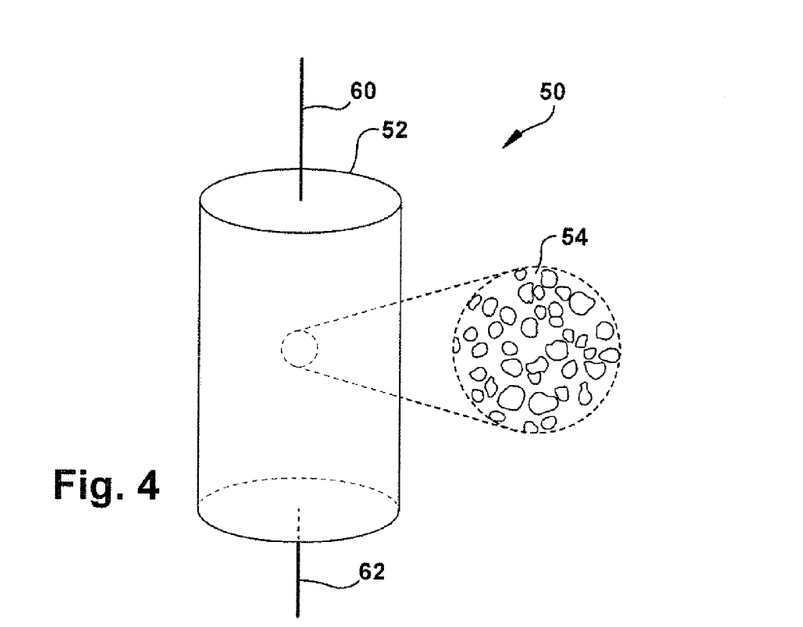
FIG. 4 is a schematic illustration of an alternative variable resistor device, according to another embodiment of the present invention.

FIG. 4 illustrates a variable resistor device 50 in accordance with another embodiment of the present invention. Variable resistor device 50 includes an insulating container 52 filled with a nanoparticle composite material 54 which comprises a variable-conductivity material and a conductive material and integrated metal electrodes 60, 62 to facilitate electrical contact. Accordingly, the variable resistor device includes a composite material of any of the embodiments described above, an insulating container and two electrodes.

Alternative to the film structure described above, the composite material 54 is in the form of a "particle re-composite" and is useful in large or macroscale devices. In the case of the film-based devices described above, the nanocrystallite size of the variable-conductivity material is dictated by the pore size in which it is formed. In the case of the particle re-composite devices such as variable resistor device 50, the nanocrystallite size is determined by the powder production process, for example sintering and ball-milling processes. Such macro-scale devices, for example the canister-type variable resistor, may be engineered in size and geometry (e.g. length and diameter) to increase power dissipation for systems where higher power tolerance is needed.

Composite materials which are particle re-composites provide a highly economical means of producing large-scale memristive devices. As described in the examples below, combining porous silicon (Si) particles with ball-milled particulates of metal-oxide material yields a composite structure that allows for controlled volumetric ratio of the silicon and metal-oxide constituents and enables variation of grain-boundary density through particle size.

The composition ranges possible in a nanocomposite, for example a nanoncomposite used in a memristor device, can depend on the form or physical structure of the composite. For example, a porous semiconductor material or host that is infiltrated with variable-conductivity, material such as metal-oxide may require a minimum amount of the semiconductor, i.e. 10% by volume to allow physical formation of the composite. On the other hand a particle re-composite is only limited by measurement and combination technique and may comprise substantially less of one component. More specifically, a film of porous metal or semiconductor infiltrated with variable-conductivity material can have a ratio of conductive material to variable-conductivity material that ranges from about 10%: 90% to about 90% : 10%. In a particle re-composite a broader range is possible and the ratio of conductive material to variable-conductivity material can range from about 1%: 99% to about 99% : 1%.

The resistive state of the variable resistor devices 10, 50 described herein depends at least in part upon the voltage or the current history of the material when applied to the material via two terminals. The resistance may vary continuously or it may change discontinuously between distinct resistance states. It has been discovered that the minimum instantaneous resistance or "chord resistance" can be altered to an extent of three orders of magnitude by varying the composition and ratios of the variable-conductivity material and conductive material constituents of the composites. For example, the examples below show that variable resistance devices having nickel-oxide/silicon composites that had 48%, 55% and 60% nickel-oxide, by volume, exhibited resistances that ranged from 165 kΩ to 964 MΩ. This large capacity to tune memristive behavior is useful in the fabrication of large-scale memristive elements.

Artificial neural networks (ANNs) is an example of a technology that is enabled or improved by the inclusion of tunable or variable resistor devices described herein. ANNs are a variety of computation architectures which rely upon highly parallel information processing as a means of executing certain types of algorithms in an efficient manner. ANNs are modeled loosely after the structure of the human brain, which is composed of a large number of neurons, each connected to a number of other neurons by pathways called synapses. Memristors which are variable resistance devices, may be used as elements which function as synapses. While many ANNs are software-based implementations of this architecture, a memristor-based ANN would be entirely hardware-based, and is therefore expected to be more efficient and easier to produce/manufacture.

A method for making the composite material, according to an embodiment of the present invention, comprises hybridizing a nanometer-scale conductive material with a nanometer-scale variable-conductivity material to form a composite material in accordance with the present invention, including the compositions described herein.

Hybridizing can be accomplished by various methods. For example, the above method can include combining the conductive material and variable-conductivity material by mixing the materials and by further applying pressure to the mixture (e.g. pressing or compacting) to form a composite.

In another embodiment the method for making a composite comprises fabricating a nanometer-scale conductive material into a film structure having pores formed therein, and hybridizing the variable-conductive material into the pores of the film structure material comprising variable-conductivity material and conductive material.

Hybridizing a conductive material film structure can be achieved in a variety of processes. In one embodiment the method further comprises forming pores within the film structure and filling the pores of the film structure with particles of the variable-conductive material via at least one of the following techniques: sol-gel deposition through spin coating, thermal deposition, and electron beam deposition. Another optional step is annealing at a temperature depending upon the composition of the composite formed, for example, a NiO/Si composite can be annealed at a temperature that ranges from about 400° C. to about 800° C.

In another embodiment, the method comprises forming pores within the film structure, breaking the film structure into particles of conductive material, combining variable-conductivity material particles with the conductive material particles to produce a mixture, and applying pressure to the mixture to form a composite material that is a particle re-composite.

The electrical contacts can be formed on the composite materials via photolithography and thermal metal evaporation methods in order to produce a two-terminal variable resistor device.

EXAMPLES

In order to more fully and clearly describe the present invention so that those skilled in the art may better understand how to practice the present invention, the following examples are given. These examples are intended to illustrate the invention and should not be construed as limiting the invention disclosed and claimed herein in any manner.

Composite Material: Film Production and Characterization

Variable resistor devices were made by nickel-oxide NiO hybridization with porous silicon Si through sol-gel deposition. The devices were characterized by current-voltage testing under a time varying applied voltage, as described in the examples below.

Two-terminal variable resistor devices were fabricated from NiO-hybridized PSi films. PSi was formed using an anodic electrochemical etching procedure employing a hydrofluoric acid (HF) electrolyte solution (15% HF, 15% $H_2O$, 70% EtOH, by volume) to produce films of ~1 μm thickness from $n^+$-doped Si wafers (<100>, 0.01 Ω·cm). Samples of three different average pore sizes were etched by applying currents of 25, 30 and 35 mA·cm$^{-2}$. Average pore diameters of the films were measured to be approximately 19 nm, 27 nm, and 41 nm by scanning electron microscopy (SEM). NiO hybridization was carried out by sol-gel spin coating and subsequent high-temperature annealing. The sol-gel was composed of nickel acetate tetrahydrate in 2-methoxyethanol (0.05 g·mL$^{-1}$) and was drop cast onto samples and allowed to saturate the surface for several minutes before being spun at 2,500 RPM to ensure uniformity. Films were then annealed at 700° C. for 2 hours in an air ambient to promote crystallinity of the NiO.

Figure 5:
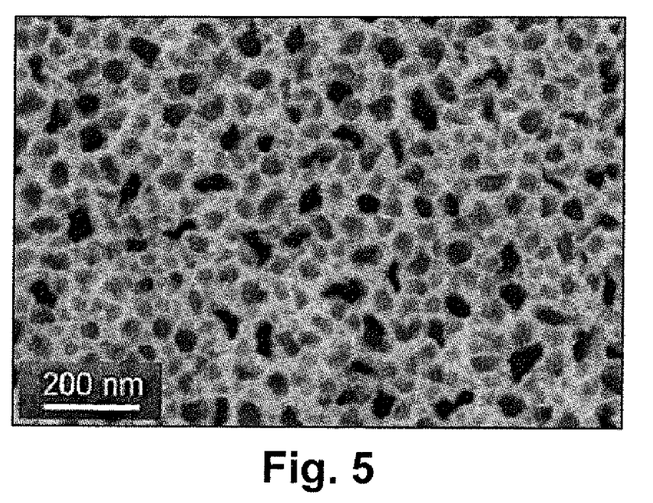
FIG. 5 is a top-view scanning electronic microscope (SEM) image of a cross-section of a nickel-oxide hybridized porous silicon (Si) film which shows pore infiltration, according to an embodiment of the present invention.

A top-view SEM image of a hybrid NiO/Si film is shown in FIG. 5. The image indicates that the majority of the pores are filled (lighter color interiors).

Figure 6:
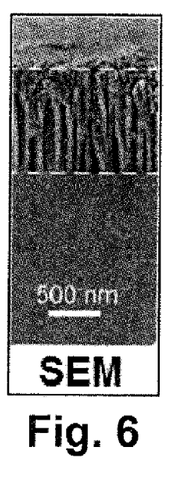
FIG. 6 is a side profile SEM image of the hybridized nickel-oxide silicon NiO/Si film of FIG. 1, according to an embodiment of the present invention.

FIG. 6 shows a side-profile SEM image of a high porosity hybrid NiO/Si composite film alongside energy dispersive x-ray spectroscopy (EDX) spatial maps. EDX was carried out with a Zeiss Merlin VP SEM/STEM instrument and all elements were quantified by monitoring and spatial mapping of the respective kα emission wavelength. Additional SEM was performed using a Raith eLiNE electron microscope. The pores were not maximally filled in this example.

Figure 7:
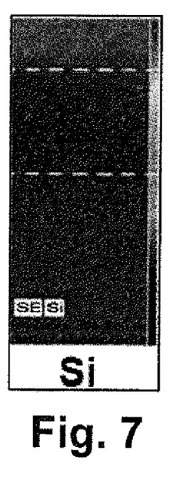
FIGS. 7 to 9 are images of an energy-dispersive x-ray spectroscopy EDX spatial mapping of the silicon, oxygen and nickel concentrations/distributions, respectively, within the film of FIGS. 5-6, according to an embodiment of the present invention.
Figure 8:
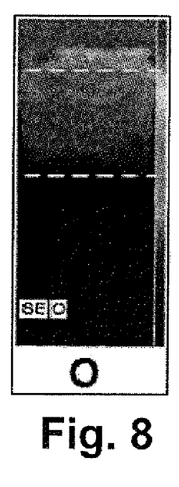
Figure 9:
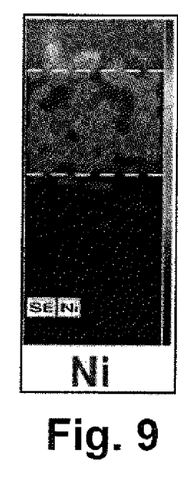

FIGS. 7-9 show the uniform distribution of elements Si, O, and Ni, respectively, within the film. X-ray diffraction spectra of the NiO-hybridized porous Si films (not shown) reveal the expected diffraction peaks associated with the rocksalt (B1) cubic structure NiO after annealing.

Figure 10:
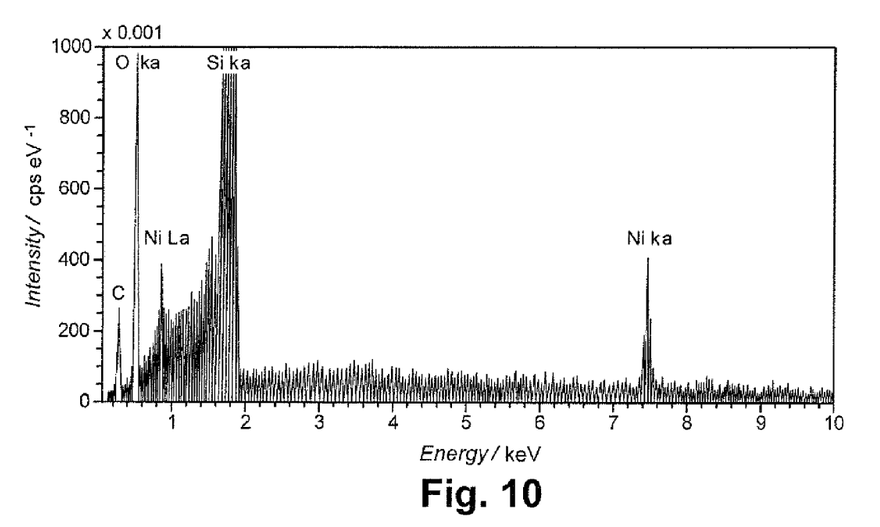
FIG. 10 is a spectrum of x-ray diffraction (XRD) of a hybridized film of nickel-oxide/silicon (NiO/Si) film of FIGS. 5-6, according to an embodiment of the present invention.

Energy dispersive x-ray spectroscopy (EDX) imaging was used to provide further insights on NiO penetration in the film. A typical EDX spectrum from within the pore interior is shown in FIG. 10. The color gradient observed in the silicon panel in FIG. 7 verified the porous Si film on top of the crystalline silicon substrate. The oxygen panel FIG. 8 showed a relatively uniform distribution of oxide throughout the porous layer, whether present in silicon dioxide and nickel oxide. The nickel panel FIG. 9 shows that the NiO sol-gel effectively infiltrated the porous Si.

Conductivity

Following NiO/PSi hybridization, two-terminal NiO/PSi hybrid memristive devices were fabricated by conventional photolithography and thermal deposition of 100 nm-thick Au contacts (Angstrom Engineering deposition system). Circular contact patterns with an electrode separation of 20 μm were fabricated and the devices were thermally annealed for 3 minutes in ambient air to promote contact adhesion. Memristors were characterized electrically by monitoring the time varying current, I, with a Keithley 2400 source-meter. Hysteresis behavior was interrogated by supplying a 0.25 Hz sinusoidal source voltage, $V_s$, amplitude ±10 V.

Figure 11A:
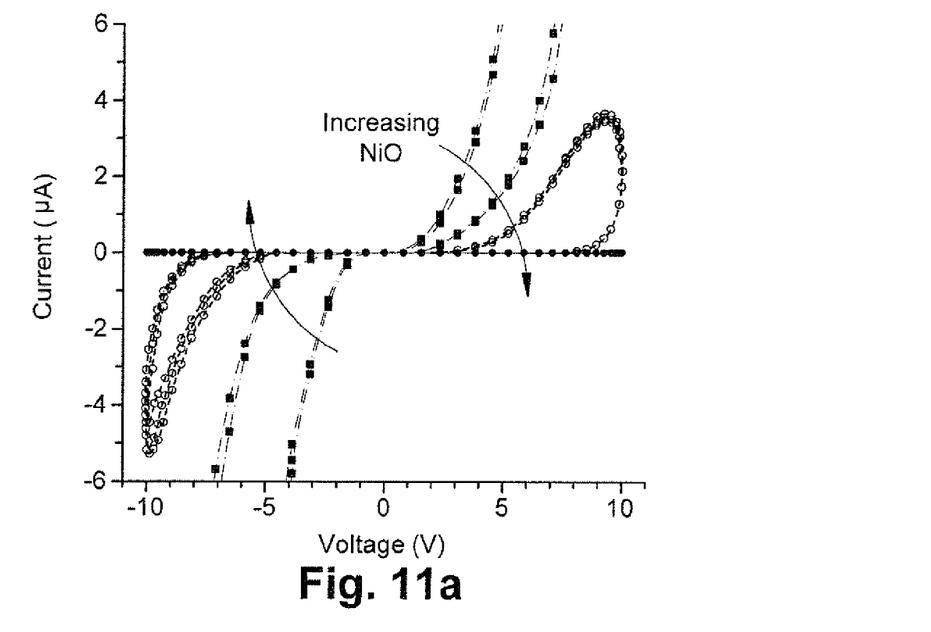
FIGS. 11a is a current-voltage plot of the measured hysteresis loops of three different nickel oxide silicon NiO/Si variable resistors, according to an embodiment of the present invention.
Figure 11B:
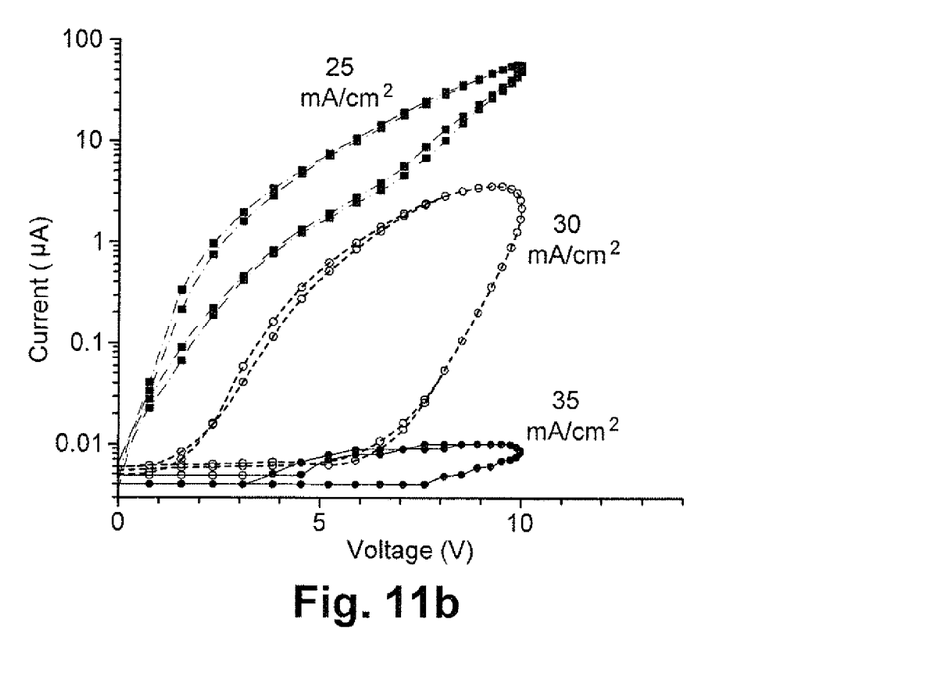
FIG. 11b is the logarithmic representation of the plots of FIG. 11a, according to an embodiment of the present invention.

FIGS. 11a and 11b show the hysteresis loops observed in the current-voltage curves of the varying porosity memristive devices (48%, 55% and 60%). The characteristic open, "pinched" current-voltage hysteresis exhibited by the devices indicates that they function as memristors. A trend in the hysteresis loops with increasing Si film porosity is evident. As film porosity was increased through increased etch current, the minimum instantaneous resistance, or chord resistance of the NiO/Si memristor increased. The smallest pore diameter films (19 nm) exhibited a minimum instantaneous resistance of 165 kΩ while the largest pore diameter NiO/P Si films (41 nm) exhibited a minimum instantaneous resistance of 962 MΩ. For comparison, analogous devices composed of pure NiO on planar, non-porous silicon were also fabricated as a control sample. The pure NiO devices were highly resistive (>5 GΩ) and exhibited no observable hysteresis loop over the voltage range examined. The dynamic range of the resistances exhibited by the devices also differs between composite films with different pore sizes, with the mid-range pore diameter (27 nm) film changing by more than two orders of magnitude.

The relative range of variation in the resistances exhibited by the devices also differed between porosities. The mid-range composition film (30 mA/cm$^2$ etch current) oscillated in resistance over two orders of magnitude, while the resistance of the other films varies by less than one order of magnitude. Results of the measured resistances are listed in Table 1.

TABLE 1

| Example | Nickel-Oxide Vol. Comp. (Film Porosity) | Vol. Ratio NiO:Si | Film Pore Size | Measured Voltage (volts) | Measured Current | Chord Resistance (ohms) |
|---|---|---|---|---|---|---|
| Control 1 | n/a | 100:0 | n/a | 0-10 V | 2 × 10$^{-9}$ | >5 GΩ |
| Ex. 1 | 60% | 60:40 | 41 nm | 0-10 V | 1.04 × 10$^{-8}$ | 962 MΩ |
| Ex. 2 | 55% | 55:45 | 27 nm | 0-10 V | 5.3 × 10$^{-6}$ | 1.89 MΩ |
| Ex. 3 | 48% | 48:52 | 19 nm | 0-10 V | 6 × 10$^{-5}$ | 165 kΩ |

Thus, the results summarized in Table 1 show that varying the composition of NiO/PSi films yielded different electrical properties, including, a significant change in the chord resistance of the variable resistor device. Conductivity is related to the volume ratio of the nickel oxide and the silicon.

State Persistence

State-persistence measurements were made by supplying a 6 V amplitude sine wave voltage (12 V, peak-to-peak) with a DC offset of 6 V. For longer duration device non-volatility tests, variable magnitude (1-20 V) square-wave pulses with 1 s duration were applied with varying periods of zero applied voltage, ranging from 1-10000 s, while measuring current. Device measurements were corroborated using a custom made op-amp based current-source circuit.

Figure 12A:
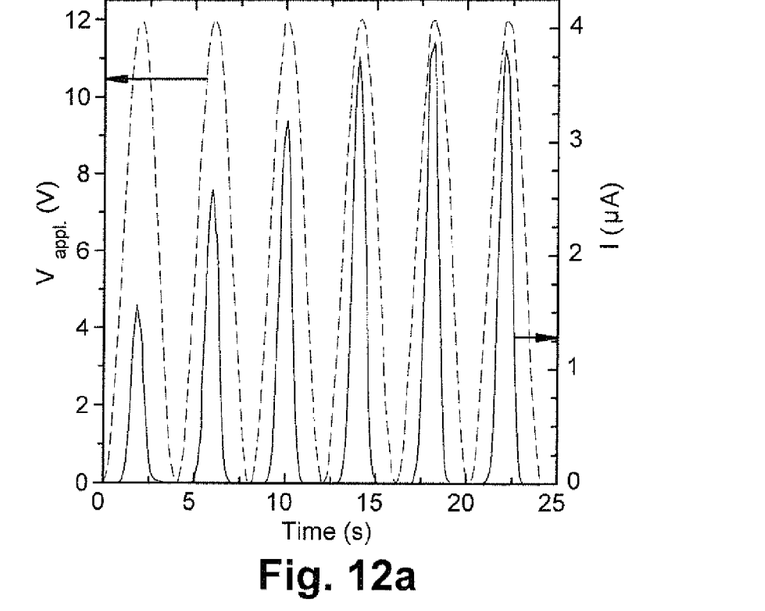
FIGS. 12a and 12b illustrate current-voltage measurements of a nickel-oxide silicon variable resistor device when sinusoidal voltages are applied with a DC offset, according to an embodiment of the present invention.
Figure 12B:
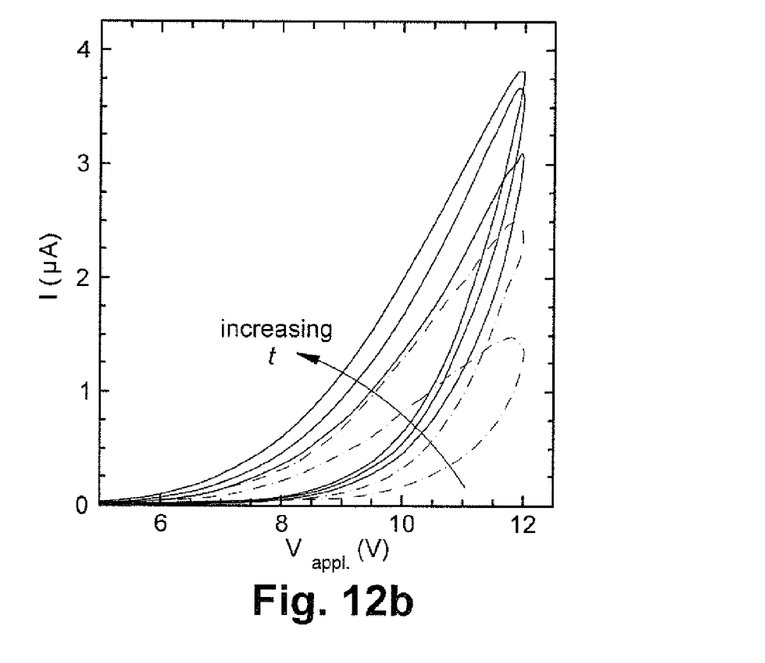

FIGS. 12a and 12b show current-voltage measurements of a NiO/Si variable resistor device having a 27 nanometer pore diameter when a sinusoidal voltage is applied with a DC offset and when 20 Volt, 1 second pulses were applied, respectively. Results showed an increasing current (decreasing resistance) trend for a NiO/PSi device under a DC-biased sinusoidal applied voltage indicating resistance state persistence.

In the first example, a sinusoidal voltage was applied with a DC offset equal to the AC wave amplitude, such that the voltage was instantaneously zero at cycle minimums, shown in FIG. 12a. The continued decrease in resistance of the device over multiple cycles was evident, showing state-persistence between cycles. It is noted that, after four cycles, the conductivity of the device saturated, indicating the minimum device resistance for the given applied voltage.

A second investigation of non-volatility was performed to determine the maximum duration over which state retention can be observed with zero applied voltage. Square-wave test-pulses were applied with 1 s duration and variable durations of zero applied voltage between pulses. A typical time-dependent current is shown in FIG. 12b.

No clear difference in average state-persistence time was observed for the different composition devices. Persistence times ranged from 10 s of seconds to more than 1000 s, likely due to differences in crystallite irregularity and pore filling uniformity between samples.

Figure 13A:
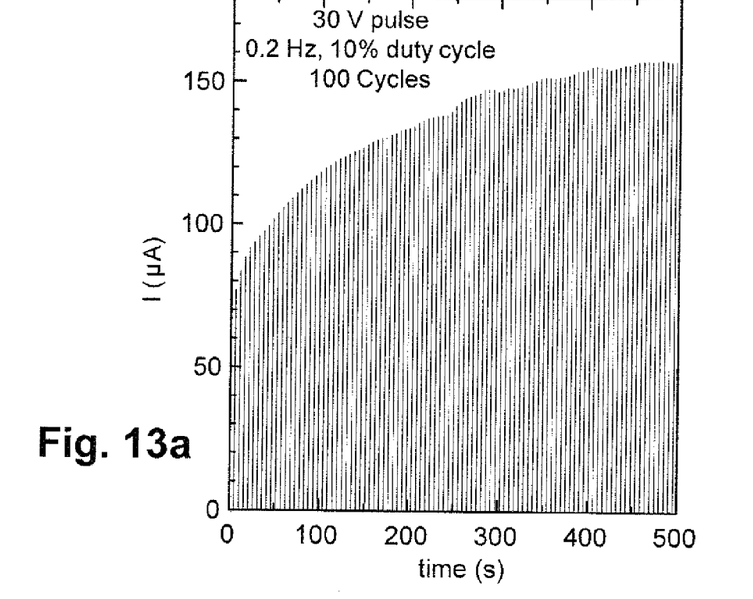
FIG. 13a-13b illustrate state persistence measurements when a nickel-oxide silicon variable resistor device is exposed to an all-positive square-wave at different frequency, according to an embodiment of the present invention.
Figure 13B:
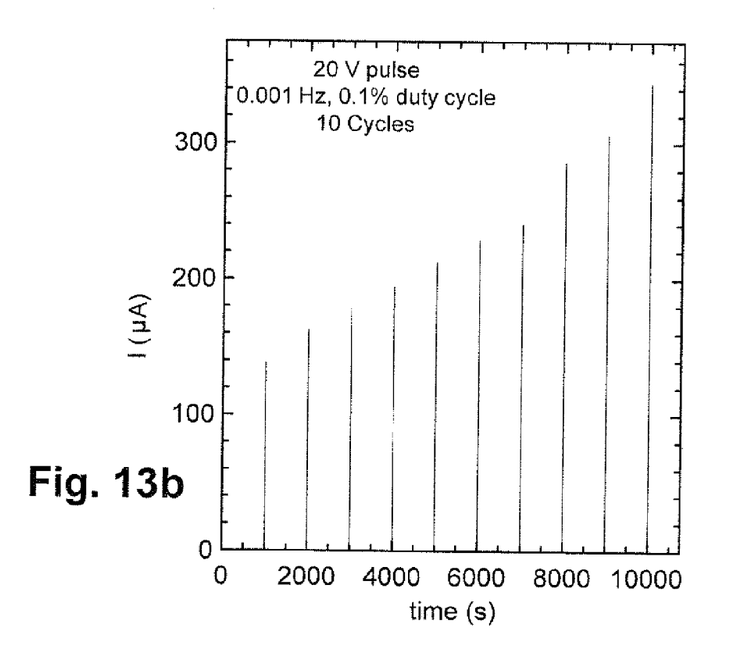

FIG. 13a-13b illustrate state persistence measurements when one such device was exposed to an all-positive square-wave with 0.2 Hz and 0.001 Hz period, respectively.

All such modifications and variations of the disclosed embodiments of the present invention are possible in light of the above teachings. Additional advantages and modifications will readily appear to those skilled in the art, and the embodiments herein are not limited to the specific details, the representative apparatus, and illustrative examples shown and described. As an example, additives and other modifying agents may be added to the composites and devices described. Accordingly, departures may be made from such details without departing from the spirit or scope of the applicant's general inventive concept. It is understood, however, that changes may be made in the particular embodiments described above which are within the full intended scope of the invention as defined in the appended claims.

What is claimed is:

1. A composite material comprising:
   from about 1% to about 99% variable-conductivity material;
   from about 99% to about 1% conductive material;
   wherein the conductive material and variable-conductivity material comprise nanometer-scale particles having an average lineal dimension that ranges from about one nanometer to about one micron: and
   wherein the composite material exhibits memristive properties when a voltage differential is applied to the composite material.

2. The composite material of claim 1, Wherein the conductive material is a metal or a semiconductor material.

3. The composite material of claim 1, wherein the conductive material is a doped semiconductor.

4. The composite material of claim 1, wherein the variable-conductivity material is a solid ionic conductor material.

5. The composite material of claim 1, wherein the variable-conductivity material is a metal oxide.

6. The composite material of claim 1, wherein the composite material comprises, by volume, from about 10% to about 90% variable-conductivity material and from about 90% to about 10% conductive material.

7. The composite material of claim 1, wherein the volumetric ratio of the variable-conductivity material to the conductive material ranges from about 35% :65% to about 70% :30%.

8. The composite material of claim 1, wherein the conductive material is selected from the group of: gold, silver, silicon, germanium gallium arsenide, and mixtures thereof.

9. The composite material of claim 1, wherein the variable conductivity material is a metal oxide selected from the group of nickel oxide, zinc oxide, titanium dioxide hafnium oxide, silicon oxide, vanadium oxide and mixtures thereof.

10. The composite material of claim 1, wherein the variable-conductivity material is a solid ionic conductor material selected from the group of: silver iodide, copper iodide, lanthanum fluoride, silver fluoride, and combinations thereof.

11. The composite material of claim 1, wherein the composite material comprise, by volume, from about 35% to about 65% silicon and from about 65% to about 35% nickel oxide.

12. The composite material of claim 1, wherein the variable-conductivity material is nickel-oxide and the conductive material is silicon.

13. The composite material of claim 12, wherein the volume ratio of nickel-oxide to silicon ranges from about 1% :99% to about 99% :1%.

14. The composite material of claim 12, wherein the volume ratio of nickel-oxide to silicon ranges from about 35% :65% to about 75% :25%.

15. The composite material of claim 1, wherein the composite material has a minimum resistance that ranges from about 1 kΩ to about 5 GΩ when a voltage differential that ranges from zero to 10 Volts is applied to the composite material.

16. A variable resistor device comprising:
a composite material comprising a nanometer-scale conductive material and nanometer-scale variable-conductive material;
a first electrode connected to the composite material and a second electrode connected to the composite material; and
wherein the variable resistor device exhibits memristive properties in response to voltage applied across the first electrode and the second electrode.

17. The variable resistor device of claim 16, wherein the nanometer-scale conductive material and the nanometer-scale variable-conductive material comprise particles having an average diameter that ranges from about one nanometer to about one micron.

18. The variable resistor device of claim 16, wherein the variable-conductivity material of the composite comprises metal oxide.

19. The variable resistor device of claim 16, wherein the conductive material of the composite comprises semiconductor material.

20. The composite material of claim 16, wherein the variable-conductivity material of the composite comprises a solid ionic conductor material.

21. The variable resistor device of claim 16, wherein the volumetric ratio of the variable-conductivity material to the conductive material ranges from about 1% :99% to about 99% :1%.

22. The variable resistor device of claim 16, wherein the volumetric ratio of the variable-conductivity material to the conductive material ranges from about 35% :65% to about 75% :25%.

23. The variable resistor device of claim 16, wherein the conductive material is selected from the group of: gold, silver, silicon, germanium, gallium arsenide, and mixtures thereof.

24. The variable resistor device of claim 18, wherein the metal oxide material is selected from the group of: nickel oxide, zinc oxide, titanium dioxide, hafnium oxide, silicon oxide, vanadium oxide and mixtures thereof.

25. The variable resistor device of claim 16, wherein the composite material comprises, by volume, from about 25% to about 75% nickel-oxide and from about 75% to about 25% silicon.

26. The variable resistor device of claim 16, wherein the composite material is a film structure.

27. The variable resistor device of claim 26, wherein the conductive material is present in the film as a host material having defined pores, and the variable-conductivity material is present as an intercalating material disposed within the pores.

28. A method for making a composite comprising:
hybridizing a nanometer-scale conductive material with a nanometer-scale variable-conductivity material to form a composite material comprising, by volume, from about 1% to about 99% variable-conductivity material and from about 99% to about 1% conductive material.

29. The method of claim 28, wherein the ratio, by volume, of variable-conductivity material to conductive material ranges from about 25% :75% to about 75% :25%.

30. The method of claim 28, wherein hybridizing comprises:
forming the conductive material into a film structure having pores therein; and
fining the pores of the film structure with particles of the variable-conductive material via at least one of the following techniques: sol-gel deposition, thermal deposition, and electron beam deposition.

31. The method of claim 28, further comprising:
fabricating a first electrode and a second electrode on the composite via photolithography; and
wherein the first electrode and the second electrode comprise a material selected from the group of: gold, silver, platinum, nickel, aluminum and mixtures thereof.

32. The method of claim 28, wherein:
the conductive material is selected from the group of: gold, silver, silicon, germanium, gallium, arsenide, and mixtures thereof; and
the variable-conductivity material is selected from the group of: nickel oxide, zinc oxide, titanium dioxide, hafnium oxide, silicon oxide, vanadium oxide, silver iodide, copper iodide, lanthanum fluoride, silver fluoride and mixtures thereof.

* * * * *

UNITED STATES PATENT AND TRADEMARK OFFICE
CERTIFICATE OF CORRECTION

Page 1 of 1

PATENT NO. : 9,231,209 B2
APPLICATION NO. : 14/081409
DATED : January 5, 2016
INVENTOR(S) : Jeremy West Mares et al.

It is certified that error appears in the above-identified patent and that said Letters Patent is hereby corrected as shown below:

Claims

Claim 1, column 12, line 39 reads "micron:" should read --micron;--

Claim 2, line 43, column 12 reads "Wherein" should read --wherein--

Claim 15, column 13, line 17 reads "about 1 kΩto about 5 GΩwhen a voltage differential that ranges from zero to 10 Volts is applied to the composite material." should read --about 1 kΩ to about 5 GΩ when a voltage differential that ranges from zero to 10 Volts is applied to the composite material.--

Claim 30, line 32, column 14 reads "fining" should read --filling--

Signed and Sealed this
Tenth Day of May, 2016

Michelle K. Lee
*Director of the United States Patent and Trademark Office*